(12) United States Patent
Chun et al.

(10) Patent No.: US 12,063,754 B2
(45) Date of Patent: Aug. 13, 2024

(54) FLEXIBLE DISPLAY DEVICE

(71) Applicant: LG ELECTRONICS INC., Seoul (KR)

(72) Inventors: Sehoon Chun, Seoul (KR); Insu Song, Seoul (KR); Jaewook Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 251 days.

(21) Appl. No.: 17/633,341

(22) PCT Filed: Aug. 8, 2019

(86) PCT No.: PCT/KR2019/009944
§ 371 (c)(1),
(2) Date: Feb. 7, 2022

(87) PCT Pub. No.: WO2021/025210
PCT Pub. Date: Feb. 11, 2021

(65) Prior Publication Data
US 2022/0287193 A1 Sep. 8, 2022

(51) Int. Cl.
*H05K 5/02* (2006.01)
*H05K 5/00* (2006.01)

(52) U.S. Cl.
CPC .......... *H05K 5/0217* (2013.01); *H05K 5/0017* (2013.01)

(58) Field of Classification Search
CPC ............................ H05K 5/0017; H05K 5/0217
USPC ........................................................ 361/807
See application file for complete search history.

(56) References Cited

U.S. PATENT DOCUMENTS

| 2009/0051830 | A1 | 2/2009 | Matsushita et al. |
| 2014/0211399 | A1* | 7/2014 | O'Brien ................ G06F 1/1652 29/592.1 |
| 2016/0147261 | A1* | 5/2016 | Bohn .................... G06F 1/1652 455/566 |
| 2020/0033913 | A1* | 1/2020 | Yang ................... H04M 1/0268 |
| 2020/0221585 | A1* | 7/2020 | Cho ..................... H05K 5/0217 |
| 2022/0240400 | A1* | 7/2022 | Zhou ....................... G09F 9/301 |

FOREIGN PATENT DOCUMENTS

| KR | 10-1107127 B1 | 1/2012 |
| KR | 10-2014-0059274 A | 5/2014 |
| KR | 10-2019-0004618 A | 1/2019 |
| KR | 10-2019-0062855 A | 6/2019 |

* cited by examiner

*Primary Examiner* — Hung S. Bui
(74) *Attorney, Agent, or Firm* — Birch, Stewart, Kolasch & Birch, LLP

(57) ABSTRACT

The present invention relates to a flexible display device, comprising: a first body; a second body configured to be movable relative to the first body; a support plate installed on the rear surface of the second body and configured to be movable relative to the second body; a flexible display unit configured such that areas exposed to the outside are changed while the first body and the second body move relative to each other; and a driving unit generating a driving force such that the second body slides with respect to the first body, wherein as the driving unit causes a movement of the second body through a rotational force by means of a motor, the areas exposed to the outside of the front part and the rear part of the flexible display unit can be changed respectively.

16 Claims, 13 Drawing Sheets

(a)

(b)

(a)

(b)

(a)  (b)

(a)

(b)

(c)

FLEXIBLE DISPLAY DEVICE

CROSS REFERENCE TO RELATED APPLICATIONS

This application is the National Phase of PCT International Application No. PCT/KR2019/009944, filed on Aug. 08, 2019, which is hereby expressly incorporated by reference into the present application.

TECHNICAL FIELD

The present disclosure relates to a flexible display device having a flexible display unit deformable by external force.

BACKGROUND ART

Portable electronic devices (hereinafter, mobile terminals), such as communication terminals, multimedia devices, portable computers, game machines, and photographing devices, include displays for displaying image information. Such a mobile terminal also has a folding structure to be foldable into a smaller size for convenience of carrying. In this type of electronic device, two bodies are connected by the folding structure (e.g., a hinge part).

Since the related art display has a non-foldable structure, a structure in which the display is disposed over two bodies that are foldably connected could not be implemented. Therefore, a large screen could not be applied to an electronic device having a folding structure.

However, recently, with the development of a flexible display capable of being bent, research on a flexible display applicable to a mobile terminal is undergoing, and thus an implementation of a large screen of a device is allowed.

Such a flexible display device can change a screen size differently by using deformable characteristics of a flexible display. For example, a flexible display device in which a flexible display is drawn out of a body to expand an exposed area to outside so as to have a screen size desired by a user may be considered.

However, in order to take advantages of the deformable characteristics of the flexible display in the flexible display device, many components must be installed inside and thereby the structure of the flexible display device is highly likely to be complicated. Even in this case, many components to be installed at an inner space may cause a spatial limitation, which may make it difficult to secure a sufficient battery installation space. In addition, as the flexible display is deformed, an unnecessary weight may be applied to the flexible display, which may decrease durability of the device.

Accordingly, it is necessary to consider a method of enabling smooth movement of a flexible display for implementing various states and of securing sufficient battery performance by employing a mechanism of a flexible display device that is capable of exposing screens to front and rear surfaces of a frame.

DISCLOSURE OF INVENTION

Technical Problem

A first aspect of the present disclosure is to provide a flexible display device having a new rolling-type mechanism for realizing various screens of a flexible display unit.

A second aspect of the present disclosure is to provide a structure of a flexible display device, capable of realizing smooth movement of a flexible display unit, stably supporting the flexible display unit although the flexible display unit is deformed, and securing a sufficient space for accommodating a large-capacity battery in a body.

Solution to Problem

To achieve these and other advantages and in accordance with the purpose of the present invention, as embodied and broadly described herein, there is provided a flexible display device that may include a first body, a second body configured to be movable relative to the first body, a support plate disposed on a rear surface of the second body to be movable relative to the second body, a flexible display unit configured to change a region thereof exposed to outside while the first body and the second body move relative to each other, and a driving unit configured to generate driving force for sliding the second body with respect to the first body. The driving unit may allow the second body to be moved using rotational force produced by a motor, so as to change externally-exposed areas of a front part and a rear part of the flexible display unit.

As another example, the flexible display unit may be configured to implement a first state in which an area exposed through a rear part of the second body is increased as the first body and the second body are located adjacent to each other, and a second state in which an area exposed through a front part of the first body is increased as the first body and the second body move away from each other.

As another example, the flexible display unit may be configured to be switched to the first state and to the second state by relative movement of a plurality of parts.

As another example, the flexible display unit may include a first region coupled to the front part of the first body, a second region coupled to the support plate, and a third region located between the first region and the second region. The first state may be implemented such that the second body is in close contact with the first body to increase an area of the first region of the flexible display unit. The second state may be implemented such that the second body moves away from the first body to increase an area of the first region.

As another example, the driving unit may include an upper cover and a lower cover coupled to the upper cover to define an inner space, and a rack guide may be formed on one side of the lower cover to guide movement of a rack to correspond to an outer shape of the rack.

As another example, the connecting rod may be movable along a roller shaft disposed on one side of a roller.

As another example, the motor and a gear portion may be disposed on the lower cover.

As another example, the gear portion may include a first gear connected to a shaft gear disposed on a center of the motor and configured to rotate in one direction, a second gear having one side connected to the first gear and another side connected to a rack gear formed on one surface of the rack, and a third gear disposed between the first gear and the second gear to transmit the rotational force.

As another example, the flexible display unit may be configured such that at least a portion thereof is deformed inside the second body to correspond to an outer surface of the roller.

As another example, the flexible display device may further include a sawtooth member disposed to cover an outer surface of the roller and having a plurality of teeth on an outer surface thereof.

As another example, the flexible display device may further include a support frame coupled to one side of a rear surface of the flexible display unit and configured to move along an outer surface of the roller in response to deformation of the flexible display unit.

As another example, the support frame may be provided with a plurality of support bars disposed side by side with being spaced apart from one another at regular intervals, and each of the support bars may move with being in contact with the outer surface of the roller.

As another example, the connecting rod may be provided with a hinge portion formed on one side thereof, and the hinge portion may allow the rack to rotate relative to the connecting rod according to a distance of the rack moved along the rack guide.

As another example, the first body may include sliding guides recessed into both inner surfaces, respectively, and the second body may include sliding members disposed to be relatively movable along the sliding guides.

As another example, the flexible display device may further include a rear plate coupled to a rear surface of the flexible display unit to be deformed together with the flexible display unit.

Advantageous Effects of Invention

Effects of the present disclosure that can be obtained through the solution will be described as follows.

First, a flexible display device can change areas of a flexible display unit exposed to front and rear surfaces of the terminal through the relative movement between a first body and a second body. This can allow a screen to be adjusted (implemented) into various sizes through the front and rear surfaces. Accordingly, a consumer can variously utilize the flexible display device as a mobile phone, a tablet, and the like.

Second, deformation of the flexible display unit can be achieved through relative movement between the first body and the second body, and continuous operations to various states can be allowed. In implementing the movement of the second body, a rotary motion of a motor can be switched into a linear motion by a rack, a connecting rod, and a roller, which may result in enabling stable behavior and securing a sufficient space between the first and second bodies. This can also secure an additional battery installation space. Even when the flexible display unit is deformed, a support frame that supports the flexible display unit can allow smooth deformation of the flexible display unit and prevent an application of an unnecessary weight, thereby improving reliability.

Figure 2:
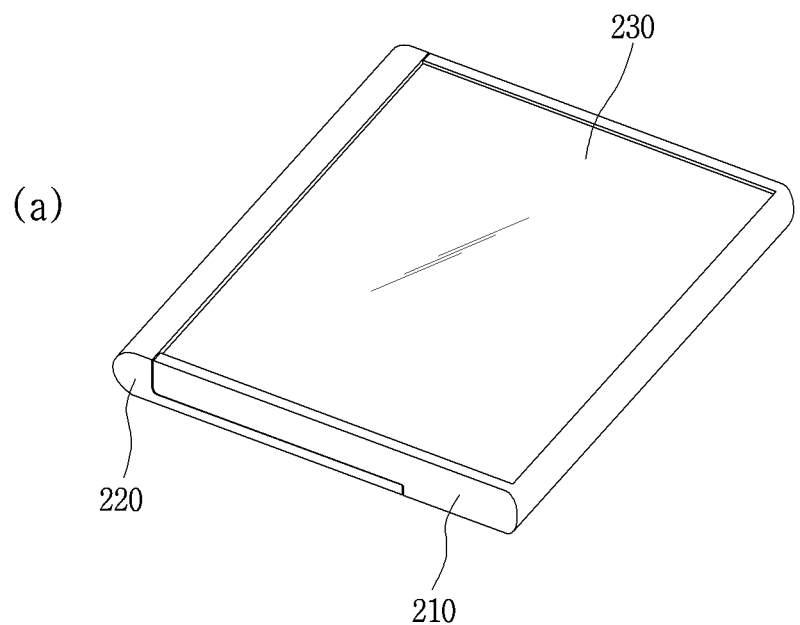
Figure 2:
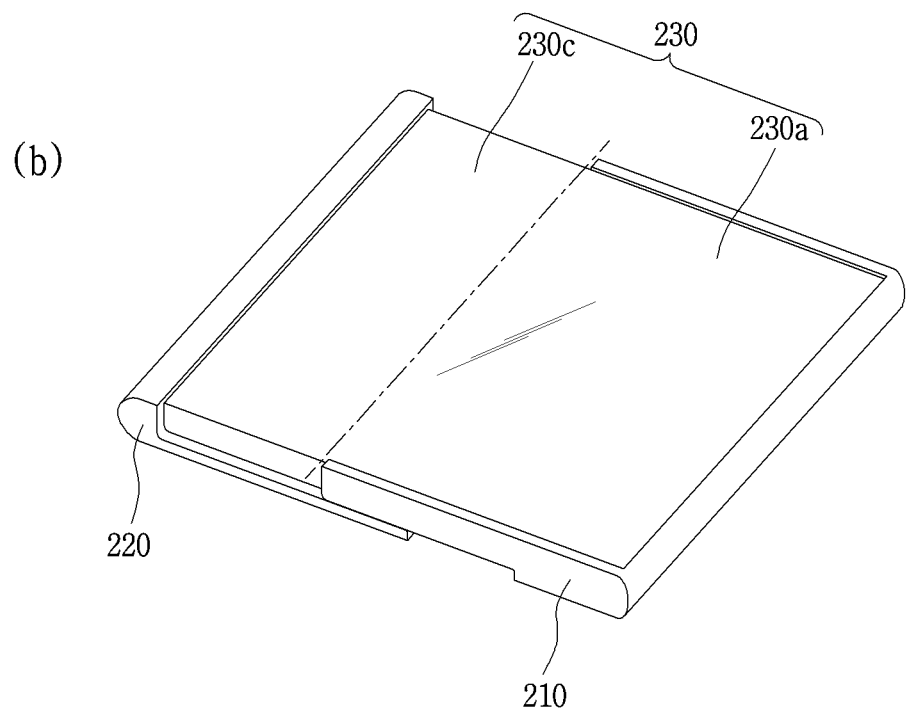

(a) of FIG. 2 is a perspective view illustrating appearance of a front part of a flexible display device in a first state.

(b) of FIG. 2 is a perspective view illustrating the appearance of the front part of the flexible display device in a second state.

Figure 3:
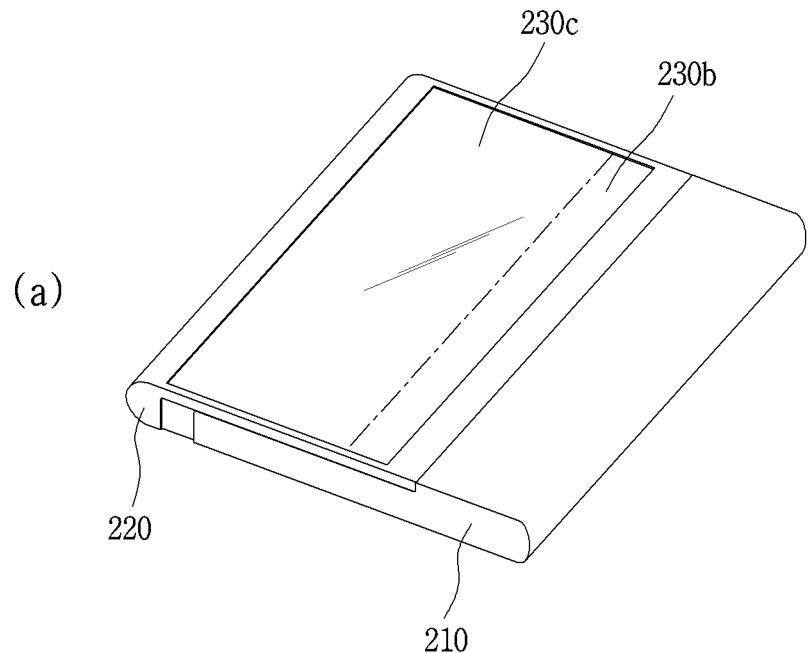
Figure 3:
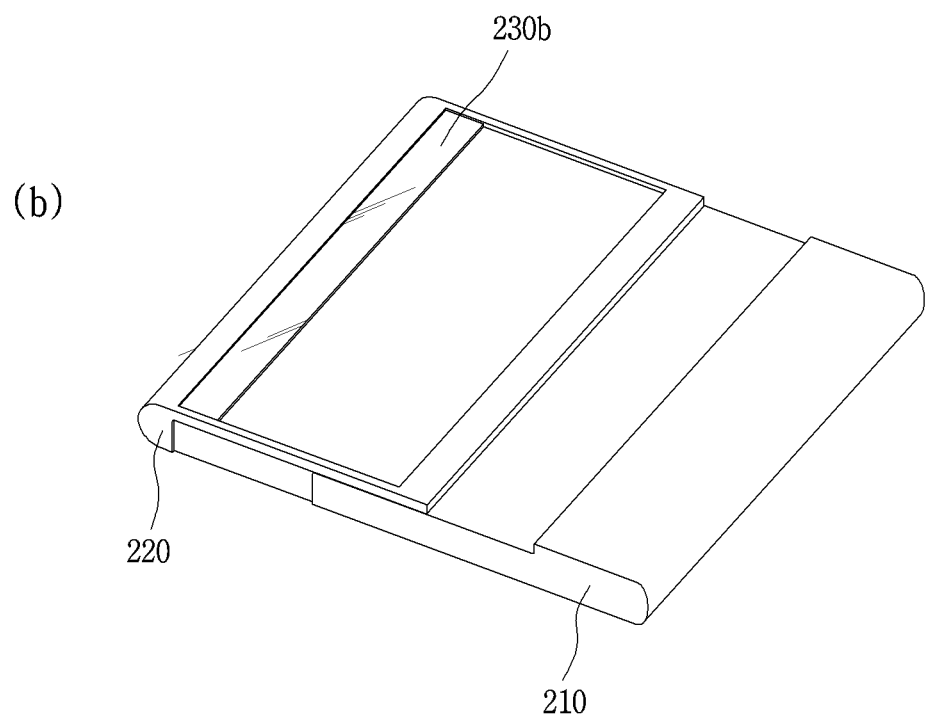

(a) of FIG. 3 is a perspective view illustrating appearance of a rear part of the flexible display device in the first state.

(b) of FIG. 3 is a perspective view illustrating the appearance of the rear part of the flexible display device in the second state.

Figure 4A:
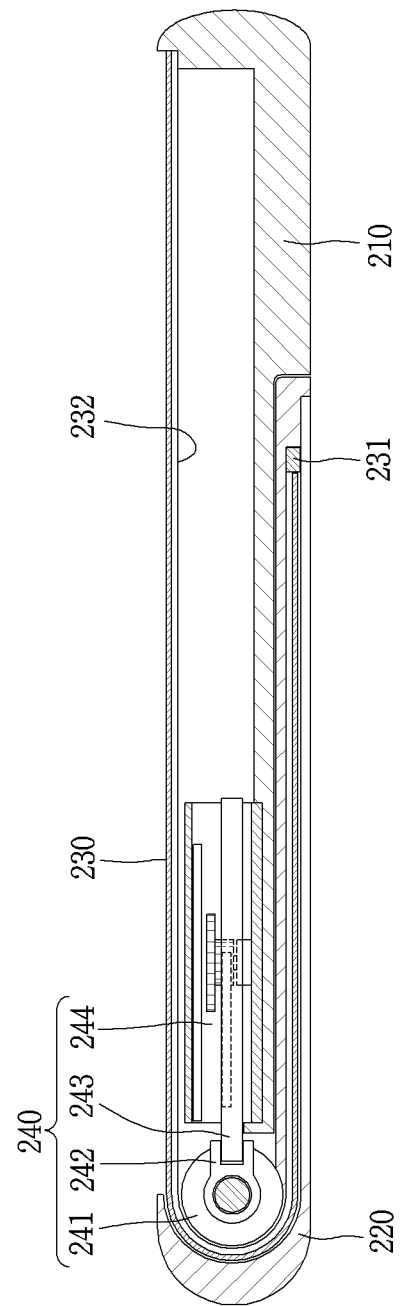

FIG. 4A is a cross-sectional view of the flexible display device in the first state.

Figure 4B:
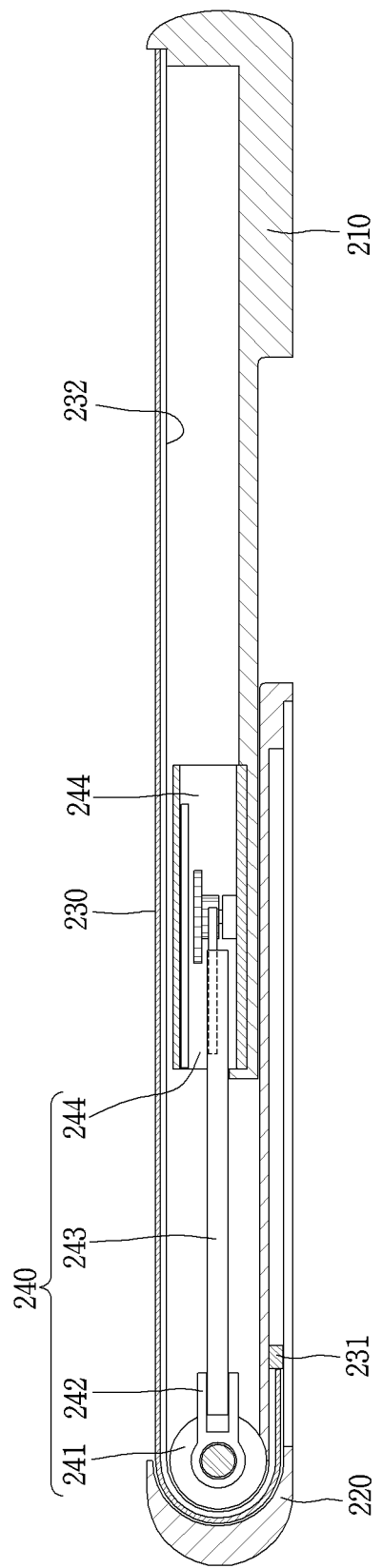

FIG. 4B is a cross-sectional view of the flexible display device in the second state.

Figure 5A:
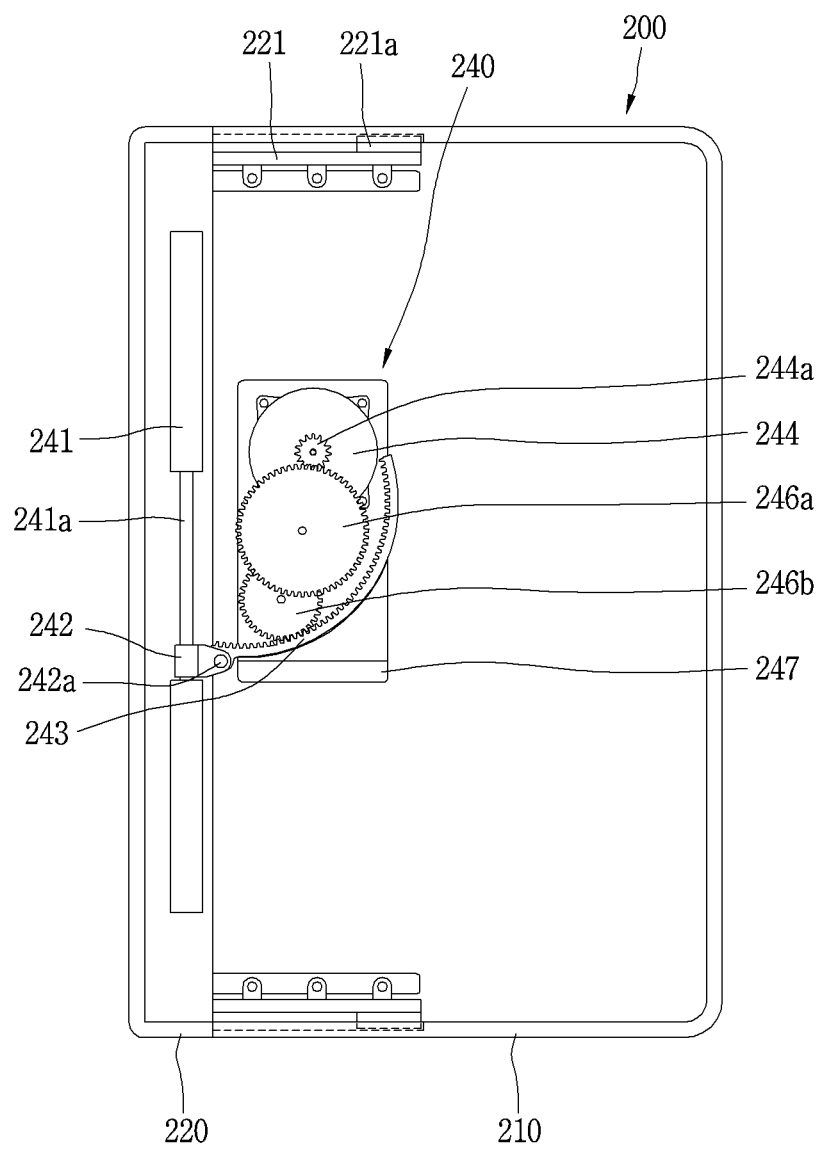

FIG. 5A is a conceptual view illustrating an inside of the flexible display device in the first state.

Figure 5B:
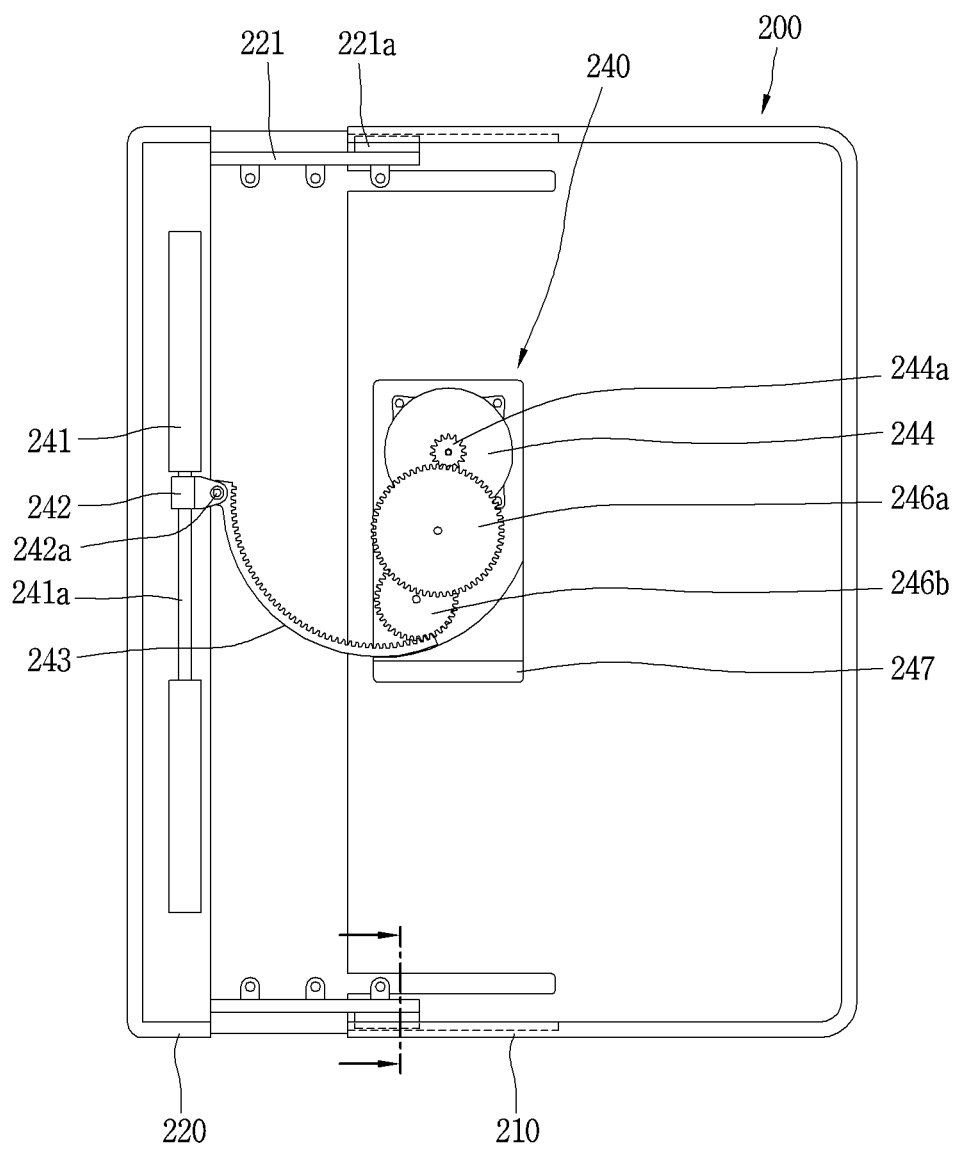

FIG. 5B is a conceptual view illustrating the inside of the flexible display device in the second state.

Figure 5C:
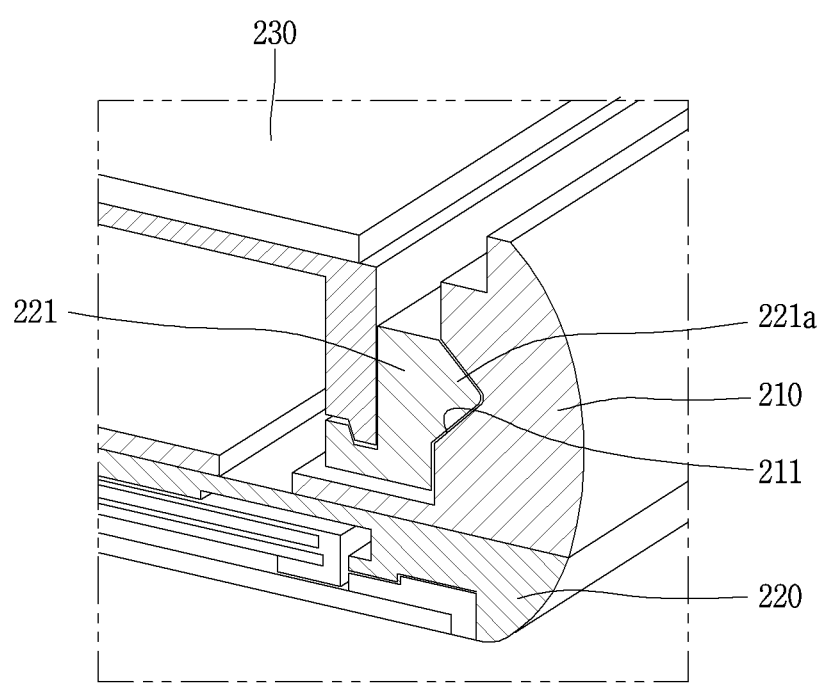

FIG. 5C is an enlarged view illustrating a state when the first body and the second body move relative to each other.

Figure 6:
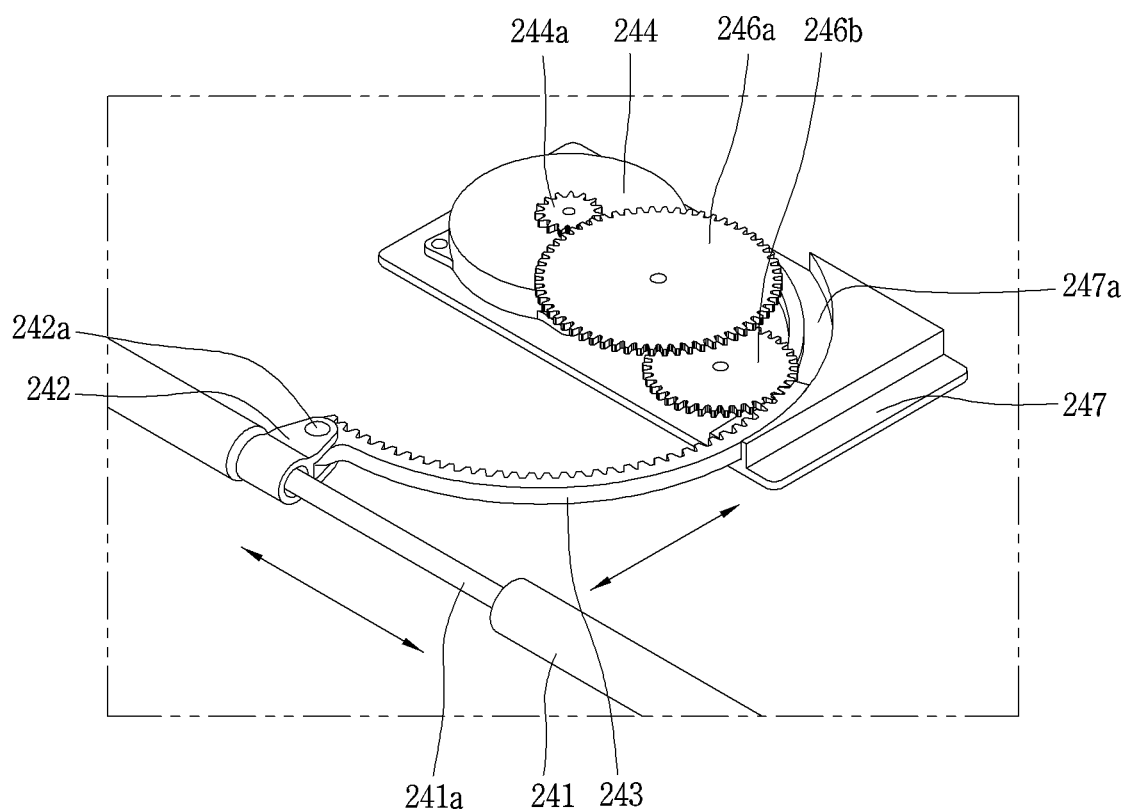

FIG. 6 is a perspective view illustrating a driving unit.

Figure 7:
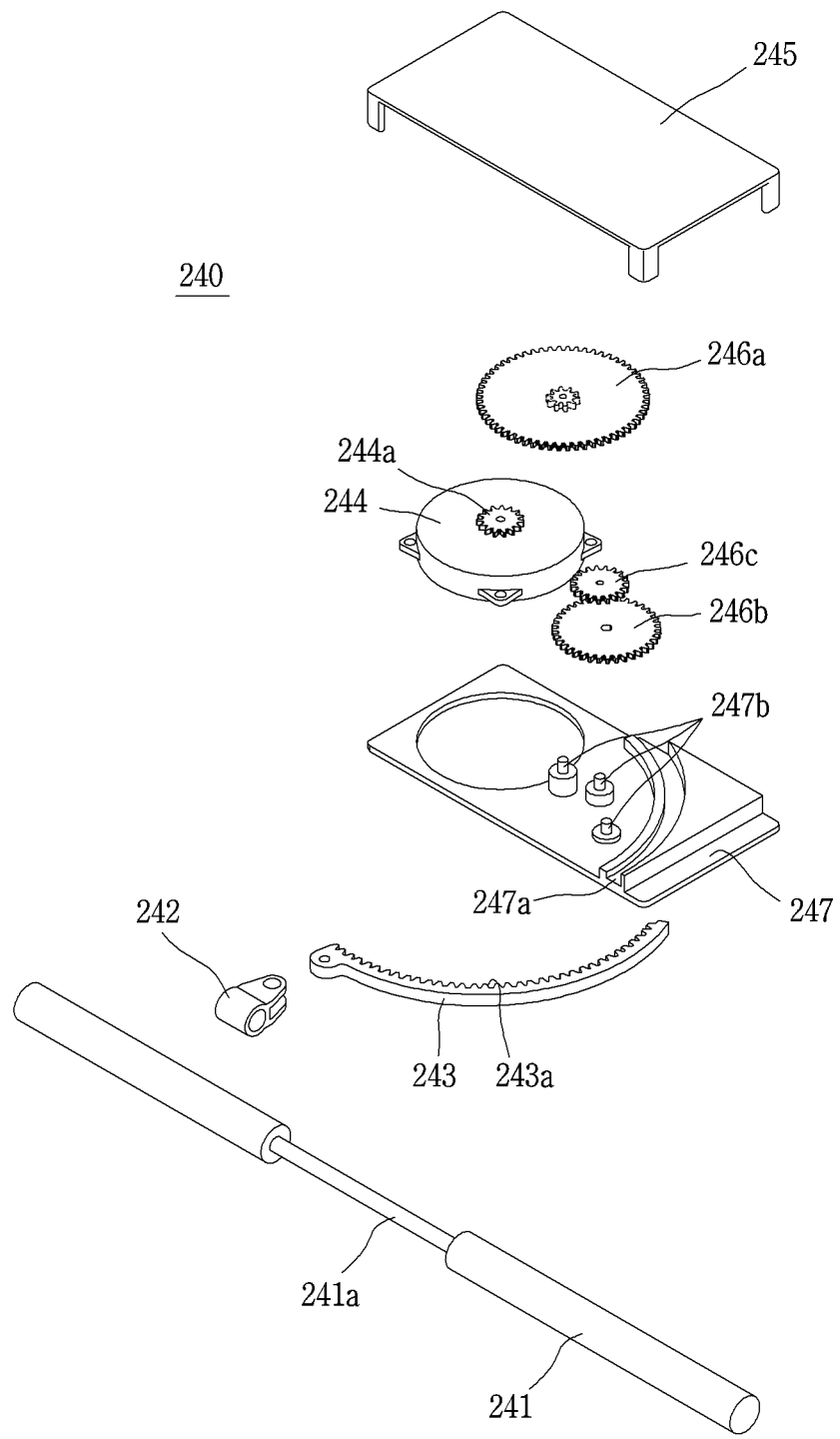

FIG. 7 is an exploded perspective view of the driving unit.

Figure 8:
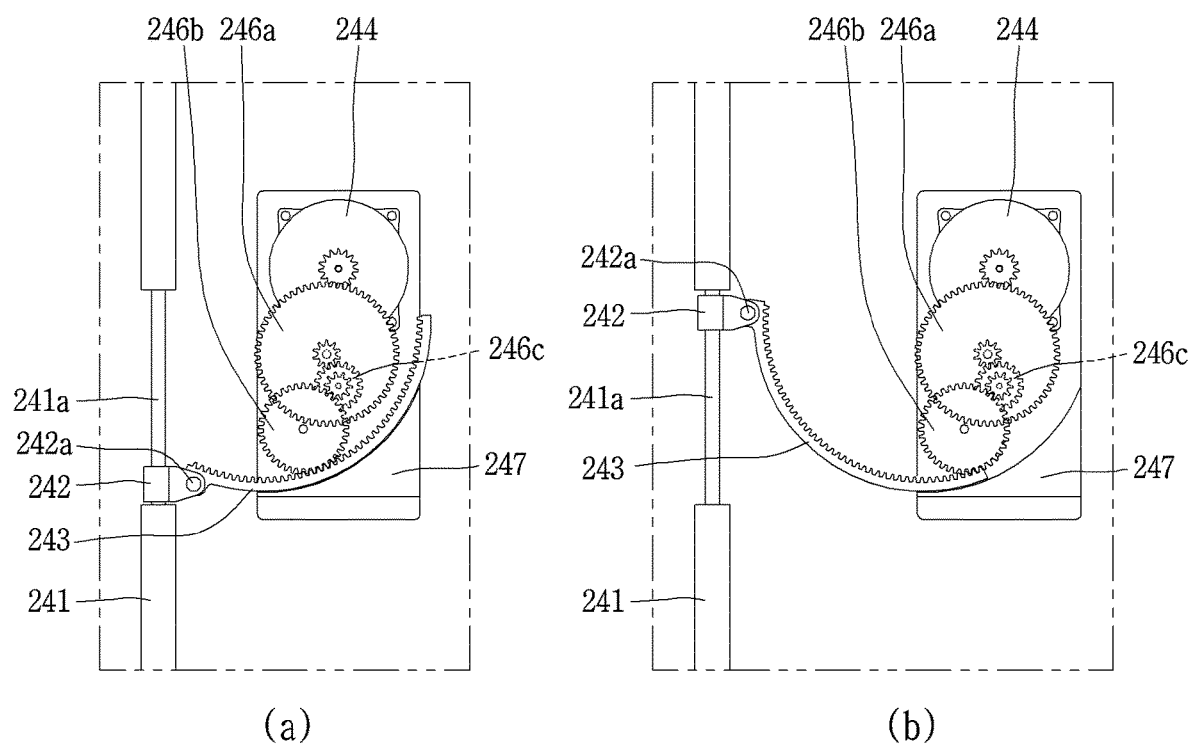

(a) of FIG. 8 is a conceptual view illustrating the driving unit in a state in which the first body 210 and the second body 220 are in close contact with each other.

(b) of FIG. 8 is a conceptual view illustrating the driving unit in a state in which the first body 210 and the second body 220 are spaced apart from each other.

Figure 9:
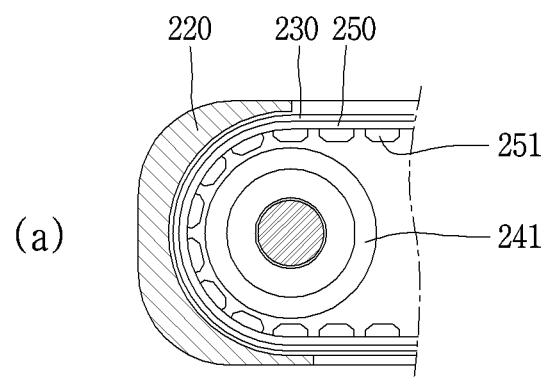
Figure 9:
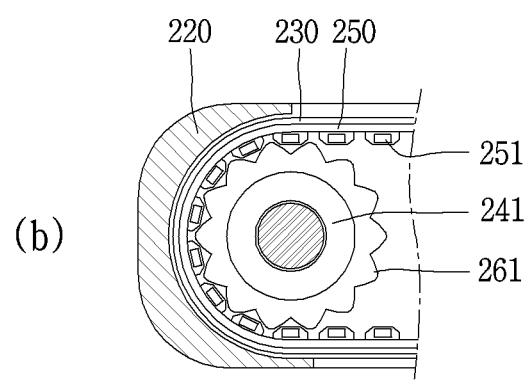
Figure 9:
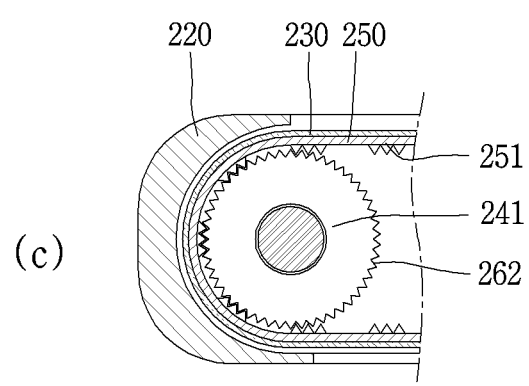

FIG. 9 is a view illustrating various implementations for realizing movement of a support frame according to movement of a roller.

Figure 10:
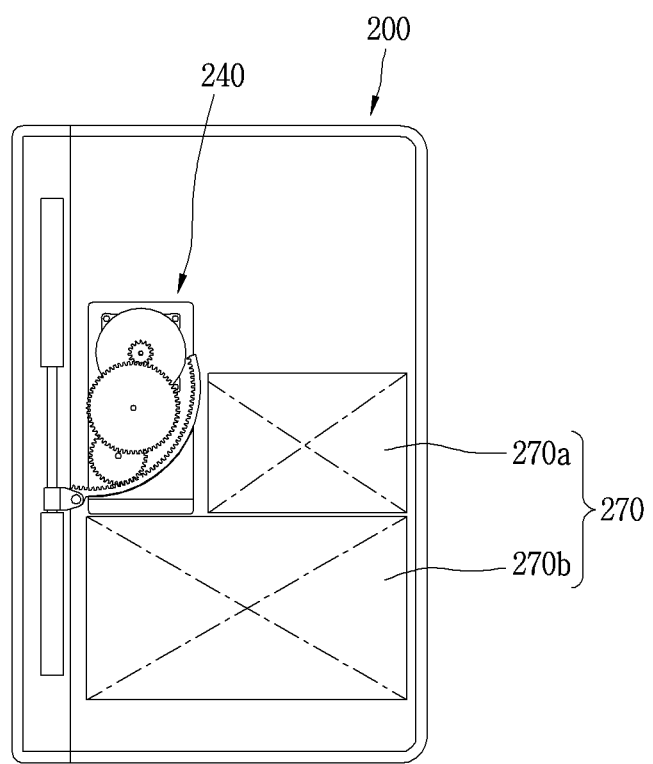

FIG. 10 is a conceptual view illustrating a flexible display device in accordance with the present disclosure.

MODE FOR THE INVENTION

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings. The idea of the present disclosure should be construed to extend to any alterations, equivalents and substitutes besides the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be connected with the another element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Display devices presented herein may be implemented using a variety of different types of terminals. Examples of such devices include cellular phones, smart phones, laptop computers, digital broadcast terminals, personal digital assistants (PDAs), portable multimedia players (PMPs), navigators, slate PCs, tablet PCs, ultra books, wearable devices (for example, smart watches, smart glasses, head mounted displays (HMDs)), and the like.

However, it may be easily understood by those skilled in the art that the configuration according to the exemplary embodiments of this specification can also be applied to stationary terminals such as digital TV, desktop computers, digital signages, and the like, excluding a case of being applicable only to the mobile terminals. Hereinafter, for convenience of description, in this specification, a mobile terminal will be described as an example of a flexible display device.

Figure 1:
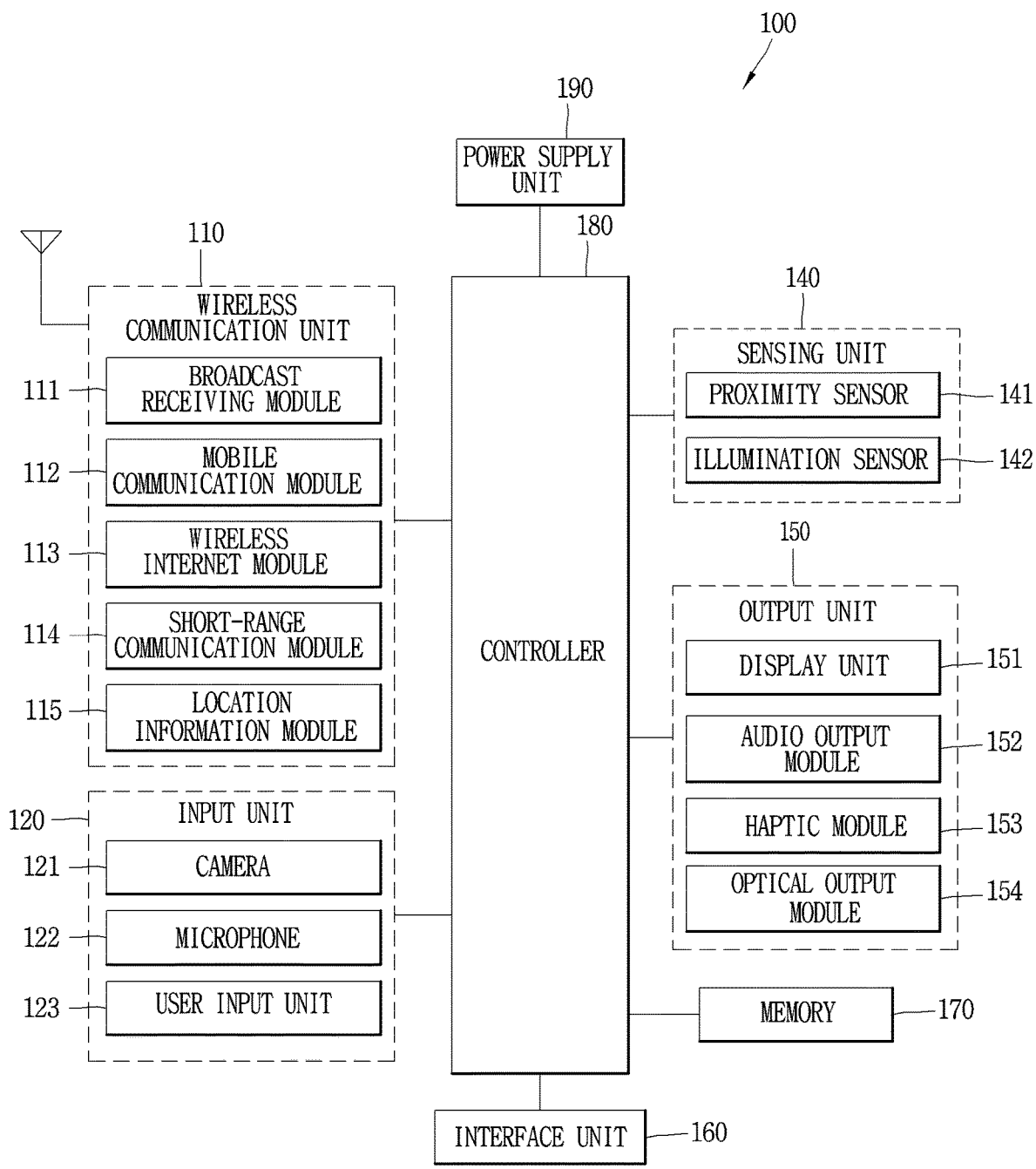
FIG. 1 is a block diagram illustrating an example of a mobile terminal.

FIG. 1 is a block diagram illustrating an example of a mobile terminal.

The mobile terminal 100 may be shown having components such as a wireless communication unit 110, an input unit 120, a sensing unit 140, an output unit 150, an interface unit 160, a memory 170, a controller (or control unit) 180, and a power supply unit 190. It is understood that implementing all of the illustrated components is not a requirement. Greater or fewer components may alternatively be implemented.

In more detail, the wireless communication unit 110 may typically include one or more modules which permit communications such as wireless communications between the mobile terminal 100 and a wireless communication system, communications between the mobile terminal 100 and another mobile terminal, or communications between the mobile terminal 100 and an external server. Further, the wireless communication unit 110 may typically include one or more modules which connect the mobile terminal 100 to one or more networks.

The wireless communication unit 110 may include one or more of a broadcast receiving module 111, a mobile communication module 112, a wireless Internet module 113, a short-range communication module 114, and a location information module 115.

The input unit 120 may include a camera 121 or an image input unit for obtaining images or video, a microphone 122, which is one type of audio input device for inputting an audio signal, and a user input unit 123 (for example, a touch key, a mechanical key, and the like) for allowing a user to input information. Data (for example, audio, video, image, and the like) may be obtained by the input unit 120 and may be analyzed and processed according to user commands.

The sensing unit 140 may typically be implemented using one or more sensors configured to sense internal information of the mobile terminal, the surrounding environment of the mobile terminal, user information, and the like. For example, the sensing unit 140 may include at least one of a proximity sensor 141, an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like). The mobile terminal disclosed herein may be configured to utilize information obtained from one or more sensors of the sensing unit 140, and combinations thereof.

The output unit 150 may typically be configured to output various types of information, such as audio, video, tactile output, and the like. The output unit 150 may be shown having at least one of a display 151, an audio output module 152, a haptic module 153, and an optical output module 154. The display 151 may have an inter-layered structure or an integrated structure with a touch sensor in order to implement a touch screen. The touch screen may function as the user input unit 123 which provides an input interface between the mobile terminal 100 and the user and simultaneously provide an output interface between the mobile terminal 100 and a user.

The interface unit 160 serves as an interface with various types of external devices that are coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions related to a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). Application programs may be stored in the memory 170, installed in the mobile terminal 100, and executed by the control unit 180 to perform an operation (or function) for the mobile terminal 100.

The control unit 180 typically functions to control an overall operation of the mobile terminal 100, in addition to the operations associated with the application programs. The control unit 180 may provide or process information or functions appropriate for a user by processing signals, data, information and the like, which are input or output by the aforementioned various components, or activating application programs stored in the memory 170.

Also, the controller 180 may control at least some of the components illustrated in FIG. 1A, to execute an application program that have been stored in the memory 170. In addition, the control unit 180 may control at least two of those components included in the mobile terminal 100 to activate the application program.

The power supply unit 190 may be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

At least part of the components may cooperatively operate to implement an operation, a control or a control method of a mobile terminal according to various embodiments disclosed herein. Also, the operation, the control or the control method of the mobile terminal may be implemented on the mobile terminal by an activation of at least one application program stored in the memory 170.

Hereinafter, description will be given in more detail of the aforementioned components with reference to FIG. 1A, prior to describing various embodiments implemented through the mobile terminal 100.

First, regarding the wireless communication unit 110, the broadcast receiving module 111 is typically configured to receive a broadcast signal and/or broadcast associated information from an external broadcast managing entity via a broadcast channel. The broadcast channel may include a satellite channel, a terrestrial channel, or both. In some embodiments, two or more broadcast receiving modules may be utilized to facilitate simultaneous reception of two or more broadcast channels, or to support switching among broadcast channels.

The broadcast management server may be a server that generates and transmits a broadcast signal and/or broadcast associated information or a server that receives a previously generated broadcast signal and/or broadcast associated information and transmits the same to a terminal. The broadcast signal may include a TV broadcast signal, a radio broadcast signal, a data broadcast signal, and the like. Also, the broadcast signal may further include a broadcast signal in a form that a TV or radio broadcast signal is combined with a data broadcast signal.

The broadcast signal may be encrypted by at least one of technical standards (or broadcasting methods, e.g., ISO, IEC, DVB, ATSC, etc.) for transmitting and receiving a digital broadcast signal. The broadcast receiving module 111 may receive the digital broadcast signal using a method suitable for a technical standard selected from those technical standards.

Examples of the broadcast associated information may include information associated with a broadcast channel, a broadcast program, a broadcast service provider, and the like. The broadcast associated information may be provided via a mobile communication network. In this case, the broadcast associated information may be received by the mobile communication module 112.

The broadcast associated information may be implemented in various formats. For instance, broadcast associated information may include Electronic Program Guide (EPG) of Digital Multimedia Broadcasting (DMB), Electronic Service Guide (ESG) of Digital Video Broadcast-Handheld (DVB-H), and the like. The broadcast signal and/or the broadcast related information received through the broadcast receiving module 111 may be stored in the memory 160.

The mobile communication module 112 can transmit and/or receive wireless signals to and from one or more network entities. Typical examples of a network entity include a base station, an external mobile terminal, a server, and the like. Such network entities form part of a mobile communication network, which is constructed according to technical standards or communication methods for mobile communications (for example, Global System for Mobile Communication (GSM), Code Division Multi Access (CDMA), CDMA2000 (Code Division Multi Access 2000), EV-DO (Enhanced Voice-Data Optimized or Enhanced Voice-Data Only), Wideband CDMA (WCDMA), High Speed Downlink Packet access (HSDPA), HSUPA (High Speed Uplink PacketAccess), Long Term Evolution (LTE), LTE-A (Long Term Evolution-Advanced), and the like).

The wireless signal may include various types of data depending on a voice call signal, a video call signal, or a text/multimedia message transmission/reception.

The wireless Internet module 113 refers to a module for wireless Internet access. This module may be internally or externally coupled to the mobile terminal 100. The wireless Internet module 113 may transmit and/or receive wireless signals via communication networks according to wireless Internet technologies.

Examples of such wireless Internet access include Wireless LAN (WLAN), Wireless Fidelity (Wi-Fi), Wi-Fi Direct, Digital Living Network Alliance (DLNA), Wireless Broadband (WiBro), Worldwide Interoperability for Microwave Access (WiMAX), High Speed Downlink Packet Access (HSDPA), High Speed Uplink Packet Access (HSUPA), Long Term Evolution (LTE), LTE-advanced (LTE-A) and the like. The wireless Internet module 113 may transmit/receive data according to one or more of such wireless Internet technologies, and other Internet technologies as well.

When the wireless Internet access is implemented according to, for example, WiBro, HSDPA, HSUPA, GSM, CDMA, WCDMA, LTE, LTE-A and the like, as part of a mobile communication network, the wireless Internet module 113 performs such wireless Internet access. As such, the Internet module 113 may cooperate with, or function as, the mobile communication module 112.

The short-range communication module 114 is configured to facilitate short-range communications. Suitable technologies for implementing such short-range communications include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, Wireless USB (Wireless Universal Serial Bus), and the like. The short-range communication module 114 in general supports wireless communications between the mobile terminal 100 and a wireless communication system, communications between the mobile terminal 100 and another mobile terminal 100, or communications between the mobile terminal and a network where another mobile terminal 100 (or an external server) is located, via wireless area networks. One example of the wireless area networks is a wireless personal area network.

Here, another mobile terminal (which may be configured similarly to mobile terminal 100) may be a wearable device, for example, a smart watch, a smart glass or a head mounted display (HMD), which is able to exchange data with the mobile terminal 100 (or otherwise cooperate with the mobile terminal 100). The short-range communication module 114 may sense or recognize the wearable device, and permit communication between the wearable device and the mobile terminal 100. In addition, when the sensed wearable device is a device which is authenticated to communicate with the mobile terminal 100, the control unit 180, for example, may cause transmission of at least part of data processed in the mobile terminal 100 to the wearable device via the short-range communication module 114. Hence, a user of the wearable device may use the data processed in the mobile terminal 100 on the wearable device. For example, when a call is received in the mobile terminal 100, the user may answer the call using the wearable device. Also, when a message is received in the mobile terminal 100, the user can check the received message using the wearable device.

The location information module 115 is generally configured to detect, calculate, derive or otherwise identify a position (or current position) of the mobile terminal. As an example, the location information module 115 includes a Global Position System (GPS) module, a Wi-Fi module, or both. For example, when the mobile terminal uses a GPS module, a position of the mobile terminal may be acquired using a signal sent from a GPS satellite. As another example, when the mobile terminal uses the Wi-Fi module, a position of the mobile terminal can be acquired based on information related to a wireless access point (AP) which transmits or receives a wireless signal to or from the Wi-Fi module. If desired, the location information module 115 may alternatively or additionally function with any of the other modules of the wireless communication unit 110 to obtain data related to the position of the mobile terminal. The location information module 115 is a module used for acquiring the position (or the current position) and may not be limited to a module for directly calculating or acquiring the position of the mobile terminal.

The input unit 120 is for inputting image or video information (or signal), audio information (or signal), data, or user input. The mobile terminal 100 may include one or a plurality of cameras 121 through which such image information can be obtained. Such cameras 121 may process image frames of still pictures or video obtained by image sensors in a video or image capture mode. The processed image frames can be displayed on the display 151 or stored in memory 170. Meanwhile, the cameras 121 may be arranged in a matrix configuration to permit a plurality of images having various angles or focal points to be input to the mobile terminal 100. Also, the cameras 121 may be located in a stereoscopic arrangement to acquire left and right images for implementing a stereoscopic image.

The microphone 122 processes an external audio signal into electric audio (sound) data. The processed audio data can be processed in various manners according to a function being executed in the mobile terminal 100. If desired, the microphone 122 may include assorted noise removing algorithms to remove unwanted noise generated in the course of receiving the external audio signal.

The user input unit 123 is a component that permits input by a user. Such user input may enable the control unit 180 to control operation of the mobile terminal 100. The user input unit 123 may include one or more of a mechanical input element (for example, a mechanical key, a button located on a front and/or rear surface or a side surface of the mobile terminal 100, a dome switch, a jog wheel, a jog switch, and the like), or a touch-sensitive input element, among others. As one example, the touch-sensitive input element may be a virtual key, a soft key or a visual key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

The sensing unit 140 is generally configured to sense one or more of internal information of the mobile terminal, surrounding environment information of the mobile terminal, user information, or the like, and generate a corresponding sensing signal. The control unit 180 generally cooperates with the sending unit 140 to control operations of the mobile terminal 100 or execute data processing, a function or an operation associated with an application program installed in the mobile terminal based on the sensing signal. The sensing unit 140 may be implemented using any of a variety of sensors, some of which will now be described in more detail.

The proximity sensor 141 refers to a sensor to sense presence or absence of an object approaching a surface, or an object located near a surface, by using an electromagnetic field, infrared rays, or the like without a mechanical contact. The proximity sensor 141 may be arranged at an inner area of the mobile terminal covered by the touch screen, or near the touch screen.

The proximity sensor 141, for example, may include any of a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and the like. When the touch screen is implemented as a capacitance type, the proximity sensor 141 can sense proximity of a pointer relative to the touch screen by changes of an electromagnetic field, which is responsive to an approach of an object with conductivity. In this case, the touch screen (touch sensor) may also be categorized as a proximity sensor.

The term "proximity touch" will often be referred to herein to denote the scenario in which a pointer is positioned to be proximate to the touch screen without contacting the touch screen. The term "contact touch" will often be referred to herein to denote the scenario in which a pointer makes physical contact with the touch screen. For the position corresponding to the proximity touch of the pointer relative to the touch screen, such position will correspond to a position where the pointer is perpendicular to the touch screen. The proximity sensor 141 may sense proximity touch, and proximity touch patterns (for example, distance, direction, speed, time, position, moving status, and the like). In general, control unit 180 processes data corresponding to proximity touches and proximity touch patterns sensed by the proximity sensor 141, and cause output of visual information on the touch screen. In addition, the control unit 180 can control the mobile terminal 100 to execute different operations or process different data (or information) according to whether a touch with respect to a point on the touch screen is either a proximity touch or a contact touch.

A touch sensor senses a touch (or a touch input) applied to the touch screen (or the display unit 151) using any of a variety of touch methods. Examples of such touch methods include a resistive type, a capacitive type, an infrared type, and a magnetic field type, among others.

As one example, the touch sensor may be configured to convert changes of pressure applied to a specific part of the display 151, or convert capacitance occurring at a specific part of the display 151, into electric input signals. The touch sensor may also be configured to sense not only a touched position and a touched area, but also touch pressure and/or touch capacitance. A touch object is generally used to apply a touch input to the touch sensor. Examples of typical touch objects include a finger, a touch pen, a stylus pen, a pointer, or the like.

When a touch input is sensed by a touch sensor, corresponding signals may be transmitted to a touch controller. The touch controller may process the received signals, and then transmit corresponding data to the control unit 180. Accordingly, the control unit 180 may sense which area of the display 151 has been touched. Here, the touch controller may be a component separate from the control unit 180, the control unit 180, and combinations thereof.

Meanwhile, the control unit 180 may execute the same or different controls according to a type of touch object that touches the touch screen or a touch key provided in addition to the touch screen. Whether to execute the same or different control according to the object which provides a touch input may be decided based on a current operating state of the mobile terminal 100 or a currently executed application program, for example.

The touch sensor and the proximity sensor may be implemented individually, or in combination, to sense various types of touches. Such touches include a short (or tap) touch, a long touch, a multi-touch, a drag touch, a flick touch, a pinch-in touch, a pinch-out touch, a swipe touch, a hovering touch, and the like.

If desired, an ultrasonic sensor may be implemented to recognize location information relating to a touch object using ultrasonic waves. The control unit 180, for example, may calculate a position of a wave generation source based on information sensed by an illumination sensor and a plurality of ultrasonic sensors. Since light is much faster than ultrasonic waves, the time for which the light reaches the optical sensor is much shorter than the time for which the ultrasonic wave reaches the ultrasonic sensor. The position of the wave generation source may be calculated using this fact. For instance, the position of the wave generation source may be calculated using the time difference from the time that the ultrasonic wave reaches the sensor based on the light as a reference signal.

The camera 121, which has been depicted as a component of the input unit 120, typically includes at least one a camera sensor (CCD, CMOS etc.), a photo sensor (or image sensors), and a laser sensor.

Implementing the camera 121 with a laser sensor may allow detection of a touch of a physical object with respect to a 3D stereoscopic image. The photo sensor may be laminated on, or overlapped with, the display device. The photo sensor may be configured to scan movement of the physical object in proximity to the touch screen. In more detail, the photo sensor may include photo diodes and transistors (TRs) at rows and columns to scan content received at the photo sensor using an electrical signal which changes according to the quantity of applied light. Namely, the photo sensor may calculate the coordinates of the physical object according to variation of light to thus obtain location information of the physical object.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

Also, the display 151 may be implemented as a stereoscopic display for displaying stereoscopic images.

A typical stereoscopic display may employ a stereoscopic display scheme such as a stereoscopic scheme (a glass scheme), an auto-stereoscopic scheme (glassless scheme), a projection scheme (holographic scheme), or the like.

The audio output module 152 may receive audio data from the wireless communication unit 110 or output audio data stored in the memory 170 during modes such as a signal reception mode, a call mode, a record mode, a voice recognition mode, a broadcast reception mode, and the like. The audio output module 152 can provide audible output related to a particular function (e.g., a call signal reception sound, a message reception sound, etc.) performed by the mobile terminal 100. The audio output module 152 may also be implemented as a receiver, a speaker, a buzzer, or the like.

A haptic module 153 can be configured to generate various tactile effects that a user feels, perceives, or otherwise experiences. A typical example of a tactile effect generated by the haptic module 153 is vibration. The strength, pattern and the like of the vibration generated by the haptic module 153 may be controlled by user selection or setting by the controller 180. For example, the haptic module 153 may output different vibrations in a combining manner or a sequential manner.

Besides vibration, the haptic module 153 can generate various other tactile effects, including an effect by stimulation such as a pin arrangement vertically moving to contact skin, a spray force or suction force of air through a jet orifice or a suction opening, a touch to the skin, a contact of an electrode, electrostatic force, an effect by reproducing the sense of cold and warmth using an element that can absorb or generate heat, and the like.

The haptic module 153 can also be implemented to allow the user to feel a tactile effect through a muscle sensation such as the user's fingers or arm, as well as transferring the tactile effect through direct contact. Two or more haptic modules 153 may be provided according to the particular configuration of the mobile terminal 100.

An optical output module 154 can output a signal for indicating an event generation using light of a light source. Examples of events generated in the mobile terminal 100 may include message reception, call signal reception, a missed call, an alarm, a schedule notice, an email reception, information reception through an application, and the like.

A signal output by the optical output module 154 may be implemented in such a manner that the mobile terminal emits monochromatic light or light with a plurality of colors. The signal output may be terminated as the mobile terminal senses that a user has checked the generated event, for example.

The interface unit 160 serves as an interface for external devices to be connected with the mobile terminal 100. For example, the interface unit 160 can receive data transmitted from an external device, receive power to transfer to elements and components within the mobile terminal 100, or transmit internal data of the mobile terminal 100 to such external device. The interface unit 160 may include wired or wireless headset ports, external power supply ports, wired or wireless data ports, memory card ports, ports for connecting a device having an identification module, audio input/output (I/O) ports, video I/O ports, earphone ports, or the like.

The identification module may be a chip that stores various information for authenticating authority of using the mobile terminal 100 and may include a user identity module (UIM), a subscriber identity module (SIM), a universal subscriber identity module (USIM), and the like. In addition, the device having the identification module (also referred to herein as an "identifying device") may take the form of a smart card. Accordingly, the identifying device can be connected with the terminal 100 via the interface unit 160.

When the mobile terminal 100 is connected with an external cradle, the interface unit 160 can serve as a passage to allow power from the cradle to be supplied to the mobile terminal 100 or may serve as a passage to allow various command signals input by the user from the cradle to be transferred to the mobile terminal therethrough. Various command signals or power input from the cradle may operate as signals for recognizing that the mobile terminal is properly mounted on the cradle.

The memory 170 can store programs to support operations of the control unit 180 and store input/output data (for example, phonebook, messages, still images, videos, etc.). The memory 170 may store data related to various patterns of vibrations and audio which are output in response to touch inputs on the touch screen.

The memory 170 may include one or more types of storage mediums including a flash memory type, a hard disk type, a solid state disk (SSD) type, a silicon disk drive (SDD) type, a multimedia card micro type, a card-type memory (e.g., SD or DX memory, etc.), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, an optical disk, and the like. The mobile terminal 100 may also be operated in relation to a network storage device that performs the storage function of the memory 170 over a network, such as the Internet.

The control unit 180 may typically control operations relating to application programs and the general operations of the mobile terminal 100. For example, the control unit 180 may set or release a lock state for restricting a user from inputting a control command with respect to applications when a status of the mobile terminal meets a preset condition.

The control unit 180 can also perform the controlling and processing associated with voice calls, data communications, video calls, and the like, or perform pattern recognition processing to recognize a handwriting input or a picture drawing input performed on the touch screen as characters or images, respectively. In addition, the control unit 180 can control one ora combination of those components in order to implement various exemplary embodiments disclosed herein.

The power supply unit 190 receives external power or provides internal power and supply the appropriate power required for operating respective elements and components included in the HMD 100 under the control of the control unit 180. The power supply unit 190 may include a battery, which is typically rechargeable or be detachably coupled to the terminal body for charging.

The power supply unit 190 may include a connection port. The connection port may be configured as one example of the interface unit 160 to which an external charger for supplying power to recharge the battery is electrically connected.

As another example, the power supply unit 190 may be configured to recharge the battery in a wireless manner without use of the connection port. In this example, the power supply unit 190 can receive power, transferred from an external wireless power transmitter, using at least one of an inductive coupling method which is based on magnetic induction or a magnetic resonance coupling method which is based on electromagnetic resonance.

Various embodiments described herein may be implemented in a computer-readable medium, a machine-readable medium, or similar medium using, for example, software, hardware, or any combination thereof.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

The display module 151 may include at least one of a liquid crystal display (LCD), a thin film transistor-LCD (TFT LCD), an organic light-emitting diode (OLED), a flexible display, a three-dimensional (3D) display and an e-ink display.

The display unit 151 may be implemented using two display devices, according to the configuration type thereof. For instance, a plurality of the display units 151 may be arranged on one side, either spaced apart from each other, or these devices may be integrated, or these devices may be arranged on different surfaces.

The display unit 151 may include a touch sensor that senses a touch with respect to the display unit 151 so as to receive a control command in a touch manner. Accordingly, when a touch is applied to the display unit 151, the touch sensor may sense the touch, and a control unit 180 may generate a control command corresponding to the touch. Contents input in the touch manner may be characters, numbers, instructions in various modes, or a menu item that can be specified.

The microphone 122 may be configured to receive the user's voice, other sounds, and the like. The microphone 122 may be provided at a plurality of places, and configured to receive stereo sounds.

The interface unit 160 may serve as a path allowing the mobile terminal 100 to interface with external devices. For example, the interface unit 160 may be at least one of a connection terminal for connecting to another device (for example, an earphone, an external speaker, or the like), a port for near field communication (for example, an Infrared DaAssociation (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

At least one antenna for wireless communication may be disposed on the terminal body. The antenna may be embedded in the terminal body or formed in the case. For example, an antenna which configures a part of the broadcast receiving module 111 (see FIG. 1A) may be retractable into the terminal body. Alternatively, an antenna may be formed in a form of film to be attached onto an inner surface of a housing or a case including a conductive material may serve as an antenna.

The terminal body is provided with a power supply unit 190 (see FIG. 1A) for supplying power to the mobile terminal 100. The power supply unit 190 may include a batter 191 which is mounted in the terminal body or detachably coupled to an outside of the terminal body.

The battery 191 may receive power via a power cable connected to the interface unit 160. Also, the battery 191 may be (re)chargeable in a wireless manner using a wireless charger. The wireless charging may be implemented by magnetic induction or electromagnetic resonance.

An accessory for protecting an appearance or assisting or extending the functions of the mobile terminal 100 may further be provided on the mobile terminal 100. As one example of the accessory, a cover or pouch for covering or accommodating at least one surface of the mobile terminal 100 may be provided. The cover or pouch may cooperate with the display unit 151 to extend the function of the mobile terminal 100. Another example of the accessory may be a touch pen for assisting or extending a touch input onto a touch screen.

(a) of FIG. 2 is a perspective view illustrating appearance of a front part of a flexible display device in a first state and (b) of FIG. 2 is a perspective view illustrating the appearance of the front part of the flexible display device in a second state. (a) of FIG. 3 is a perspective view illustrating appearance of a rear part of the flexible display device in the first state and (b) of FIG. 3 is a perspective view illustrating the appearance of the rear part of the flexible display device in the second state.

The flexible display device may vary a screen size by deforming a flexible display unit (or flexible display), and thus will be understood as a type of mobile terminal described above. In this specification, a mobile terminal will be referred to as a flexible display device.

The flexible display device 200 may have a shape in which a flexible display unit 230 is exposed to outside of a first body 210 and a second body 220.

Specifically, as illustrated in FIGS. 2 and 3, the flexible display device 200 can provide a screen to a user in various ways by exposing the flexible display unit 230 to a front part and a rear part of the flexible display device 200 itself.

In addition, in the flexible display device 200, a size of a screen exposed to the front part and a size of a screen exposed to the rear part of the flexible display device 200 may vary, respectively, depending on relative movement of the first body 210 and the second body 220.

As illustrated in (a) of FIG. 2 and (a) of FIG. 3, the first body 210 and the second body 220 may be located close to each other such that the flexible display device 200 can realize a first state in which a large area of the flexible display unit 230 is exposed through the front part of the flexible display device 200.

In the first state, as illustrated in (a) of FIG. 3, an area of the flexible display unit 230 exposed to the rear part of the flexible display device 200 may be increased.

Also, as illustrated in (b) of FIG. 2 and (b) of FIG. 3, the first body 210 and the second body 220 may be spaced apart from each other such that the flexible display device 200 can realize a second state in which a large area of the flexible display unit 230 is exposed through the front part of the flexible display device 200 itself.

In the second state, as illustrated in (b) of FIG. 2, the area of the flexible display unit 230 exposed to the front part of the flexible display device 200 may be increased, and thus, as illustrated in (b) of FIG. 3, the area of the flexible display unit 230 exposed to the rear part of the flexible display device 200 may be decreased.

The flexible display device 200 may be switched from the first state to the second state or vice versa according to relative movement of the first body 210 and the second body 220.

When a direction in which the second body 220 moves away from the first body 210 is referred to as a first direction, the area of the flexible display unit 230 that is exposed to the front part according to the movement in the first direction may be increased in the first direction.

At this time, the area of the flexible display unit 230 that is exposed to the rear part may be decreased in the first direction due to the movement of the flexible display device 200 in the first direction.

On the other hand, when the second body 220 moves close to the first body 210 in a second direction opposite to the first direction, the area of the flexible display unit 230 exposed to the front part may be decreased in the second direction due to the movement of the flexible display device 200 in the second direction. At this time, the area of the flexible display unit 230 that is exposed to the rear part may be increased in the second direction due to the movement of the flexible display device 200 in the second direction.

The flexible display device 200 may include the flexible display unit 230 that is deformable by external force.

Here, deformation may mean at least one of curving, bending, folding, twisting, and rolling of a display module. The deformable display module may be referred to as 'flexible display'. Here, the flexible display unit 230 may include a typical flexible display, electronic paper (e-paper), and a combination thereof.

The typical flexible display may refer to a durable display that is lightweight and does not break easily by being fabricated on a thin, flexible substrate, such as paper, which is bent, curved, folded, twisted or rolled while maintaining characteristics of an existing flat panel display.

In addition, the electronic paper may be a display to which general ink characteristics are applied, and may be different from the existing flat panel display in view of using reflected light. The electronic paper may change information by using a twist ball or electrophoresis (electrophoresis) using a capsule.

In the flexible display device 200, one side of the flexible display unit 230 may be deformed by external force (e.g., having a finite radius of curvature) and a position of the deformed one side of the flexible display unit 230 may change in response to the relative movement of a roller 241 (see FIG. 4A), the first body 210, and the second body 220.

That is, the flexible display device 200 can implement the first state and the second state according to the change in the position of the flexible display unit 230 that is deformed along an outer surface of the roller 241 to be explained later.

The flexible display unit 230 may output visual information through an exposed screen in the first state and the second state. Such visual information may be realized by independently controlling an emission of unit pixels (subpixels) arranged in a matrix form. The unit pixel may denote an elementary unit for representing one color.

The flexible display unit 230 may be placed with its one side curved (bent) (e.g., with a predetermined curvature along the outer surface of the roller 241), not flat, in each of the first state and the second state.

When external force is applied to the flexible display unit 230, the flexible display unit 230 may be deformed into a flat state (or a less curved state) or a more curved state.

In some examples, the flexible display 230 may be combined with a touch sensor to implement a flexible touch screen (not illustrated). When a touch is applied to the flexible touch screen (not illustrated), the control unit 180 (see FIG. 1) may perform a control corresponding to the touch input. The flexible touch screen may be configured to sense a touch input even in the second state as well as the first state.

In some examples, the flexible display device 200 according to a modified example may include a deformation detecting unit that detects deformation of the flexible display unit 230. The deformation detecting unit may be included in the sensing unit 140 (see FIG. 1).

The deformation detecting unit may be disposed in the flexible display unit 230 or the body 210, 220 to detect information related to the deformation of the flexible display unit 230. Here, the information related to the deformation may be a deformed direction of the flexible display unit 230, a deformed degree, a deformed position, a deformed time, and an acceleration at which the deformed flexible display unit 230 is restored. The deformation-related information may also be various information which can be detectable due to the flexible display unit 230 being curved or bent.

At this time, the control unit 180 (see FIG. 1) may change information displayed on the flexible display unit 230 or generate a control signal for controlling the function of the flexible display device 200 based on the information related to the deformation of the flexible display unit 230 detected by the deformation detecting unit.

The state of the flexible display unit 230 may not always be switched only by the external force. For example, when the flexible display unit 230 is in the first state, the first state may be switched to the second state by a command of a user or an application or the second state may be switched to the first state in the same manner.

The flexible display device 200 may include a case (e.g., a frame, a cover, etc.) defining appearance. The case may include a first body 210 and a second body 220, and various electronic components may be disposed inside the first body 210 and the second body 220.

The first body 210 and the second body 220 may be configured to define the appearance of the flexible display unit 230. The second body 220 may move relative to the first body 210 in a sliding manner to implement the first state and the second state.

The flexible display unit 230 may be respectively coupled to one surface of the first body 210 and one surface of the second body 220 that are connected to move relative to each other, and may be deformed in response to the movement of the first body 210 and the second body 220.

The flexible display unit 230 may include a first region 230a, a second region 230b, and a third region 230c.

The first region 230a may be fixedly coupled to a front surface of the first body 210. The third region 230c adjacent to the first region 230a in the first direction may partially cover a front surface of the second body 220 and partially cover a rear surface of the second body 220. In addition, the second region 230b of the flexible display unit 230 may be located between the first region 230a and the third region 230c, and may be fixed to a support plate 231 that is slidable with respect to the second body 220 in the first direction.

That is, the flexible display unit 230 may include the first region 230a fixed to the first body 210, the second region 230b fixed to the support plate 231, and the third region 230c located between the first region 230a and the second region 230b and configured to be located on the front part or the rear part depending on the state of the flexible display device 200.

Here, the first region 230a and the second region 230b does not change in curvature and may maintain a flat default state, but the third region 230c may be bent at one side of the second body 220 to be curved to the rear surface.

When the flexible display device 200 is switched from the first state to the second state, an area of the third region 230c located adjacent to the first region 230a may be increased. Here, a position to be deformed at the third region 230c may differ depending on a sliding position of the second body 220.

That is, since a portion of the flexible display unit 230 to be deformed varies depending on the state of the flexible display device 200, external force may not be continuously applied only to one portion. This can reduce an accumulation of fatigue in the corresponding portion, thereby preventing the flexible display unit 230 from being damaged.

The first region 230a of the flexible display unit 230 may be coupled to a front part of the first body 210. Since a rear part of the first body 210 is always exposed to outside, a camera, a flash, a proximity sensor, and the like may be disposed thereon.

A side part (not shown) may be defined on a circumference of the first body 210, and may define the appearance of the flexible display device 200 except for an end portion disposed in the first direction, in which or from which the second body 220 is inserted or drawn out. An interface unit for connecting a power port or an ear jack or a user input unit such as volume buttons may be disposed on the side part. When the side part includes a metal material, it may serve as an antenna.

A rear part of the second body 220 may support a portion of the third region 230c of the flexible display unit 230. The second body 220 may be supported on the side part of the first body 210. When the first state is switched to the second state, the second body 220 may support the rear surface of the expanded flexible display unit 230. The second body 220 may support the third region 230c of the flexible display unit 230 in the second state.

The first body 210 and the second body 220 may support one region of the flexible display unit 230, respectively. A plurality of electronic components for operating the flexible display device 200 and a battery for supplying power may be mounted in an inner space defined by the first and second bodies 210 and 220.

At this time, as illustrated in FIGS. 2 and 3, the flexible display device 200 may be configured such that the second body 220 is slidable relative to the first body 210. Thus, the first body 210 and the second body 220 can be located close to each other so as to implement the first state in which an exposed area of the rear part is increased. In addition, the first body 210 and the second body 220 can be located away from each other such that the flexible display device 200 can be switched to the second state in which an exposed area of the front part is increased. Accordingly, the user can more conveniently use a screen that is adjusted to have various sizes by utilizing the regions 230a, 230b, and 230c of the flexible display unit 230, thereby executing various tasks such as watching e-books, web-surfing, and the like.

FIG. 4A is a cross-sectional view of the flexible display device 200 in the first state and FIG. 4B is a cross-sectional view of the flexible display device 200 in the second state.

The flexible display device 200 may include a first body 210, a second body 220, a support plate 231, a flexible display unit 230, and a driving unit 240.

The first body 210 and the second body 220 may define the appearance of the flexible display device. The switching between the first state and the second state may be realized according to the relative movement of the first body 210 and the second body 220.

The second body 220 may be slidable relative to the first body 210 so as to be close to or away from the first body 210. Accordingly, the first state in which the second body is in close contact with the first body can be realized as illustrated in FIG. 4A, or the second state in which the first body 210 and the second body 220 are away from each other can be realized as illustrated in FIG. 4B.

A side part of the second body 220 may be made of a non-transparent material or a transparent material. In this case, a transparent window may be disposed on the side part of the second body 220 so that an image or text output from the flexible display unit 230 can be exposed to the outside.

The flexible display unit 230 may include a first region 230a fixed to the first body 210, a second region 230b fixed to the support plate 231, and a third region 230c located between the first region 230a and the second region 230b and configured to be located on the front part or the rear part depending on the state of the flexible display device 200.

In this case, the third region 230c may be disposed on the front part or the rear part of the flexible display device 200 according to the first state and the second state realized by the relative movement between the first body 210 and the second body 220.

The support plate 231 may be disposed on a rear surface of the second body 220. The support plate 231 may be a plate-shaped member that is slidable along the rear surface or a side surface of the second body 220. The support plate 231 may be attached to the second region 230b of the flexible display unit 230. Thus, when the second body 220 is inserted into or drawn out of the first body 210, the support plate 231 may move relative to the second body 220 to correspond to an inserted or drawn-out distance of the second body 220.

The driving unit 240 may serve to produce driving force for the second body 220 to be slid relative to the first body 210. The driving unit 240 may be installed at the inner space defined by the first body 210 and the second body 220. The driving unit 240 may be fixed to an inner side of the first body 210.

The driving unit 240 may allow the second body 220 to be slid relative to the first body 210 in the first direction. At this time, the support plate 231 may be slid with respect to the second body 220 in the first direction.

The driving unit 240 may allow the second body 220 to move back and forth using rotational force produced by a motor 244. In response to the back-and-forth movement of the second body 220, exposed areas of the front part and the rear part of the flexible display unit 230 of the flexible display device 200 can be changed, respectively.

The second body 220 may be slid away from the first body 210 along the first direction by the driving unit 240, thereby realizing the second state.

The driving unit 240 may include a roller 241, a connecting rod 242, a rack 243, a motor 244, and a gear portion 246. The rack 243 may be moved by rotational force produced by the motor 244. The roller 241 connected to the rack 243 may simultaneously move, such that the second body 220 can be slid relative to the first body 210.

For example, in case where the first state of FIG. 4A is switched to the second state of the FIG. 4B by the driving unit 240, when the second body 220 is moved by a first distance d, the flexible display unit 230 may be moved by a second distance 2d corresponding to twice the first distance. In this case, in order for an end portion of the flexible display unit 230 to be moved by the second distance 2d, the support plate 231 in the second body 220 may also be moved by the same distance d as the second body 220.

The driving unit 240 may allow the flexible display device 200 to be switched from the first state to the second state or vice versa by way of causing the movement of the second body 220.

The flexible display device 200 may further include a rear plate 232. When the first state and the second state are realized through the movement of the first body 210 and the second body 220, the rear plate 232 coupled to the flexible display unit 230 may also be deformed.

The rear plate 232 may be coupled to the rear part of the flexible display unit 230. The rear plate 232 may support the flexible display unit 230. The rear plate 232 may be deformed to correspond to a deformed one side of the flexible display unit 230 as the flexible display device 200 implements the first and second states.

The rear plate 232 may be made of thin stainless steel (STS). The rear plate 232 may be deformed together with the flexible display unit 230, so as to realize the first state in (a) of FIG. 2 and (a) of FIG. 3 and the second state in (b) of FIG. 2 and (b) of FIG. 3.

When the flexible display device 200 is switched from the first state to the second state, one side of the flexible display unit 230 may be deformed to a state in which an angle is changed, which may be realized by the deformation of the rear plate 232.

One side of the third region 230c of the flexible display unit 230 may be deformed together with the rear plate 232 into a state with a predetermined curvature. The one side of the third region 230c may be in a curved state while defining a curved surface together with the rear plate 232.

In addition, the flexible display unit 230 may be coupled to the rear plate 232 through an adhesive member (not illustrated).

The adhesive member (not illustrated) may serve to couple the rear part of the flexible display unit 230 and one surface of the rear plate 232 to each other. The adhesive member (not illustrated) may be made of a material having flexible properties, to prevent the flexible display unit 230 from being loosened as a space is formed between the rear plate 232 and the flexible display unit 230 due to the deformation of the rear plate 232 and the flexible display unit 230.

The adhesive member (not illustrated) may also prevent stress from being generated between the rear plate 232 and the flexible display unit 230, thereby suppressing damage on the flexible display unit 230 due to external force.

The adhesive member (not illustrated) may be made of resin (Elastomer resin) having elasticity, such as synthetic epoxy resin or the like. Accordingly, the adhesive member (not illustrated) can allow the flexible display unit 230 and the rear plate 232 to be closely coupled to each other and also enable the flexible display unit 230 to be smoothly deformed together with the rear plate 232 even though the one side of the flexible display unit 230 is deformed.

FIG. 5A is a conceptual view illustrating an inside of the flexible display device 200 in the first state and FIG. 5B is a conceptual view illustrating the inside of the flexible display device 200 in the second state. Also, FIG. 5C is an enlarged view illustrating a state when the first body 210 and the second body 220 move relative to each other.

As described above, the flexible display device 200 can be implemented in the first state in which the area of the rear part of the flexible display unit 230 is increased and the second state in which the area of the front part of the flexible display unit 230 is increased, and also can be switched to the first state and the second state according to the relative movement between the first body 210 and the second body 220.

Specifically, the second body 220 may be slid with respect to the first body 210 so as to be close to or away from the first body 210. Accordingly, as illustrated in FIG. 5A, the first state in which the second body 220 is in close contact with the first body 210 may be realized as illustrated in FIG. 5A or the second state in which the second body 220 is moved away from the first body 210 may be realized as illustrated in FIG. 5B.

Accordingly, the flexible display device 200 can implement the flexible display unit 230 to have various screen sizes through front and rear surfaces of the terminal.

The relative movement between the first body 210 and the second body 220 may be achieved by moving sliding members 221 along sliding guides 211. Sliding rails 221a may protrude from the sliding members 221, respectively, and move in contact with the sliding guides 211.

However, driving force for the relative movement between the first body 210 and the second body 220 may be produced by the driving unit 240 to be described later.

The sliding guides 211 having a recessed shape may be formed at both inner surfaces of the first body 210. In correspondence with the sliding guides 211 recessed in the both inner surfaces of the first body 210, the sliding members 221 that are relatively movable along the sliding guides 211 may be formed in the second body 220. Also, the sliding rail 221a may protrude from one side of each of the sliding members 221 toward the sliding guide 211.

When the user pulls the second body 220 by gripping one side of the second body 220 to expand the area of the flexible display unit 230 exposed to the front part of the flexible display unit 230, a position of the roller 241 may change. Responsive to this, a position of a deformed portion of the flexible display unit 230 together with the rear plate 232 may change and thus the area of the flexible display unit 230 exposed to the front part can be expanded. In this case, the area of the flexible display unit 230 exposed to the rear part of the flexible display device 230 may be decreased.

At this time, the sliding members 221 of the second body 220 may move along the sliding guides 211 of the first body 210 by the expanded area of the flexible display unit 230, thereby covering an extended length of the flexible display unit 230.

That is, in the flexible display device 200, as the sliding members 221 of the second body 210 move along the sliding guides 211 of the first body 210, the distance between the first body 210 and the second body 220 may change. This can cause the change in the third region 230c of the flexible display unit 230, thereby allowing the flexible display device 200 to be stably switched from the first state to the second state or vice versa.

FIG. 6 is a perspective view illustrating the driving unit 240 and FIG. 7 is an exploded perspective view of the driving unit 240. Also, (a) of FIG. 8 is a conceptual view illustrating the driving unit in a state in which the first body 210 and the second body 220 are in close contact with each other and (b) of FIG. 8 is a conceptual view illustrating the driving unit in a state in which the first body 210 and the second body 220 are spaced apart from each other.

The driving unit 240 may serve to enable the relative movement between the first body 210 and the second body 220 to change the externally-exposed areas of the front part and the rear part of the flexible display unit 230. In detail, the driving unit 240 may allow the second body 220 to be slid relative to the first body 210 in the first direction. At this time, the support plate 231 may be slid with respect to the second body 220 in the first direction.

The driving unit 240 may include a roller 241, a connecting rod 242, a rack 243, a motor 244, and a gear portion 246. The driving unit 240 may cause the rack 243 to be moved by rotational force produced by the motor 244 and the second body 220 to be slid relative to the first body 210 in a manner of moving the roller 241 connected to the rack 243.

The roller 241 may have a cylindrical shape so that at least a portion of the flexible display unit 230 is rolled thereon.

The roller 241 may be located in an end portion of the second body 220 in the first direction, and may come in contact with an inner surface of the flexible display unit 230 so as to move together with the flexible display unit 230, so that the flexible display unit 230 can be naturally slid to move from the rear surface to the front surface or from the front surface to the rear surface when the second body 220 is slid.

That is, the roller 241 may be fixedly installed inside the second body 220, to allow the second body 220 to move back and forth.

The roller 241 may be connected to the connecting rod 242. A roller shaft 241a having a small diameter may be disposed on one side of a central portion of the roller 241, and the connecting rod 242 may move along an extending direction of the roller shaft 241a.

The connecting rod 242 may be connected to the rack 243 to cause a linear motion.

The movement of the rack 243 and the connecting rod 242 may cause a rotary motion by the motor 244 to be switched to the linear motion.

The connecting rod 242 may have a shape covering the roller shaft 241a and may be movable along the roller shaft 241a.

In order to enable the relative movement between the first body 210 and the second body 220, the rack 243 may move along a rack guide 247a. At this time, the connecting rod 242 connected to the rack 243 may move along the roller shaft 241a to move in an intersecting direction with the moving direction of the second body 220.

A hinge portion 242a may be disposed on one side of the connecting rod 242. The hinge portion 242a may to allow the rack 243 to rotate relative to the connecting rod 242 in correspondence with a distance of the rack 243 along the rack guide 247a. The hinge portion 242a may allow the rack 243 to rotate by a predetermined angle to correspond to the movement of the connecting rod 242 which is caused in response to the movement of the rack 243.

The rack 243 may be formed in an arcuate shape and may be configured to be movable by the gear portion 246. The rack 243 may be relatively movable by the hinge portion 242a disposed on the connecting rod 242 and may be movable along the rack guide 247a. In response to the movement of the rack 243, the roller 241 can move in the first direction and simultaneously the second body 220 can move relative to the first body 210.

A rack gear 243a having a plurality of teeth may be formed on one surface of the rack 243 having the arcuate shape. The rack gear 243a may be moved along the rack guide 247a by the gear portion 246.

The driving unit 240 may further include an upper cover 245, a lower cover 247, and a gear portion 246 and a motor 244 installed in an inner space defined by the upper cover 245 and the lower cover 247.

The upper cover 245 may be coupled to the lower cover to define the inner space, and may have a rectangular plate shape.

The lower cover 247 may have the motor 244 and the gear portion 246 installed thereon.

The rack guide 247a for guiding the movement of the rack 243 to correspond to an outer shape of the rack 243 may be formed on one side of the lower cover 247.

The rack 243 may move along the rack guide 247a. The rack 243 may be connected to be rotatable relative to the connecting rod 242 through the hinge portion 242a formed on the connecting rod 242. The rack 243 may also perform a reciprocating motion in the first direction.

The gear portion 246 may receive rotational force generated by the motor 244. The gear portion 246 may be connected to a motor shaft gear 244a that is disposed on a central portion of the motor 244 and serve to induce the movement of the rack 243a.

Here, the motor 244 may mean a BLDC motor that can be driven by direct current, but the type may vary.

The gear portion 246 may include gears 246a, 246b, and 246c each having a plurality of teeth on an outer surface thereof. For example, as illustrated in FIG. 7, the gear portion 246 may include a first gear 246a, a second gear 246b, and a third gear 246c.

The first gear 246a may be connected to the motor shaft gear 244a installed on the center of the motor 244 to rotate in one direction. The first gear 246a may be disposed to be in contact with the motor shaft gear 244a. The first gear 246a may serve to reduce a rotational speed of the motor 244.

The second gear 246b may have one side connected to the first gear 246a and another side connected to the rack gear 243a formed on one surface of the rack 243. The movement of the rack gear 243a may be made by the rotation of the second gear 246b in the one direction. The second gear 246b may serve to reduce the rotational speed of the motor 244.

In addition, as illustrated in FIG. 7, the third gear 246c may be further disposed to transfer the rotational force between the first gear 246a and the second gear 246b. The third gear 246c may be disposed between the first gear 246a and the second gear 246b to transmit the rotational force between the first and second gears 246a and 246b.

That is, in a state of (a) of FIG. 8, the rotational force generated by the operation of the motor 244 may be transmitted to the rack gear 243a through the motor shaft gear 244a, the first gear 246a, the second gear 246b, and the third gear 246c. The movement of the rack 243 may make the roller 241 moved in the first direction, as illustrated in (b) of FIG. 8, through the connecting rod 242. At this time, in order to compensate for rotation according to the movement of the rack 243 and the movement of the roller 241, the rack 243 may be rotated by a predetermined angle along the hinge portion 242a and the connecting rod 242 may be moved in an intersecting direction with the first direction along the roller shaft 241a.

FIG. 9 is a view illustrating various implementations for realizing movement of the support frame 250 according to the movement of the roller 241.

The support frame 250 may be disposed on one side of the rear surface of the flexible display unit 230. The support frame 250 may move along the outer surface of the roller 241, in response to the deformation of the flexible display unit 230. The support frame 250 may serve to prevent sagging of the flexible display unit 230 and the rear plate 232 disposed on the rear surface of the flexible display unit 230.

The support frame 250 may suppress large external force from being applied to the flexible display unit 230 when the flexible display unit 230 is deformed by the movement of the roller 241. The support frame 250 may be made of specially-processed titanium capable of maintaining (enduring) bending due to deformation.

As illustrated in (a) of FIG. 9, the support frame 250 may include a plurality of support bars 251 that are arranged side by side to face the roller 241 with being spaced apart from one another at regular intervals. At this time, each support bar 251 may move while being in contact with the outer surface of the roller 241. The support bar 251 may have a thickness with a predetermined rigidity to minimize an affection on the deformation, namely, bending of the flexible display unit 230.

In addition, as illustrated in (b) of FIG. 9, a protrusion cover 261 may be disposed on the outer surface of the roller 241 to cover the roller 241. The protrusion cover 261 may have an outer surface with a concave-convex shape. At this time, concave and convex portions formed on the outer surface of the protrusion cover 261 may be spaced apart from one another at intervals corresponding to the regular intervals of the support bars 251.

In addition, the support bars 251 may be formed by plastic injection. If necessary, as illustrated in (b) of FIG. 9, a rigid bar (not illustrated) made of a metal material may be inserted into each of the support bars 251 to reinforce rigidity of the support frame 250.

In addition, as illustrated in (c) of FIG. 9, a sawtooth member 262 that covers the roller 241 and has a plurality of teeth on an outer surface thereof may be disposed on the outer surface of the roller 241. Similarly, the support frame 250 may be provided with a plurality of teeth. In this case, the teeth formed on the sawtooth member 262 may be arranged at intervals to correspond to the teeth formed on the support frame 250.

FIG. 10 is a conceptual view illustrating the flexible display device 200 in accordance with the present disclosure.

As described above, the flexible display device 200 can change the areas of the flexible display unit 230 exposed to the front and rear surfaces of the terminal through the relative movement between the first body 210 and the second body 220. This can allow a screen to be adjusted (implemented) into various sizes through the front and rear surfaces. Accordingly, a consumer can variously utilize the flexible display device as a mobile phone, a tablet, and the like.

In order to implement the movement of the first body 210 and the second body 220, the driving unit 240 can be provided with the structure for switching the rotary motion of the motor 244 into the linear motion by the rack 243, the connecting rod 242, and the roller 241 when implementing the movement of the second body 220, thereby enabling stable behavior.

In addition, since a width of the driving unit 240 in left and right directions can be reduced, an installation space for a battery 270 which is essential for the operation of the flexible display device 200 can be sufficiently secured. This can provide an advantage of securing an installation space of even an additional battery 270a as well as a battery 270a by a simple sliding structure.

The aforementioned flexible display device is not limited to the configurations and the methods of the embodiments described above, but all or some of the embodiments may be selectively combined so that various modifications can be made.

The invention claimed is:

1. A flexible display device comprising:
   a first body;
   a second body configured to be movable relative to the first body;
   a support plate disposed on a rear surface of the second body to be movable relative to the second body;
   a flexible display unit configured to change a region thereof exposed to outside while the first body and the second body move relative to each other; and
   a driving unit configured to generate driving force for sliding the second body with respect to the first body, wherein the driving unit allows the second body to be moved using rotational force produced by a motor, so as to change externally-exposed areas of a front part and a rear part of the flexible display unit, and
   wherein the driving unit comprises:
   a gear portion configured to receive the rotational force produced by the motor;
   a rack formed in an arcuate shape and configured to be moved by the gear portion;
   a connecting rod connected to the rack to cause a linear motion; and
   a roller connected to the connecting rod, fixedly installed inside the second body, and configured to cause the second body to move back and forth.

2. The flexible display device of claim 1, wherein the flexible display unit is configured to implement:
   a first state in which an area exposed through a rear part of the second body is increased as the first body and the second body are located close to each other; and
   a second state in which an area exposed through a front part of the first body is increased as the first body and the second body move away from each other.

3. The flexible display device of claim 2, wherein the flexible display unit is configured to be switched to the first state and to the second state by relative movement of a plurality of parts.

4. The flexible display device of claim 2, wherein the flexible display unit comprises a first region coupled to the front part of the first body, a second region coupled to the support plate, and a third region located between the first region and the second region,
- wherein the first state is implemented such that the second body is in close contact with the first body to increase an area of the first region of the flexible display unit, and
- wherein the second state is implemented such that the second body moves away from the first body to increase an area of the first region.

5. The flexible display device of claim 1, wherein the driving unit comprises an upper cover and a lower cover coupled to the upper cover to define an inner space, and
- wherein a rack guide is formed on one side of the lower cover to guide movement of the rack to correspond to an outer shape of the rack.

6. The flexible display device of claim 5, wherein the connecting rod is movable along a roller shaft disposed on one side of the roller.

7. The flexible display device of claim 5, wherein the motor and the gear portion are disposed on the lower cover.

8. The flexible display device of claim 5, wherein the connecting rod is provided with a hinge portion disposed on one side thereof, the hinge portion allowing the rack to rotate relative to the connecting rod according to a distance of the rack moved along the rack guide.

9. The flexible display device of claim 1, wherein the gear portion comprises:
- a first gear connected to a shaft gear disposed on a center of the motor and configured to rotate in one direction;
- a second gear having one side connected to the first gear and another side connected to a rack gear formed on one surface of the rack; and
- a third gear disposed between the first gear and the second gear to transmit the rotational force.

10. The flexible display device of claim 1, wherein the flexible display unit is configured such that at least a portion thereof is deformed inside the second body to correspond to an outer surface of the roller.

11. The flexible display device of claim 1, further comprising a protrusion cover disposed to cover an outer surface of the roller and having an outer surface with a concave-convex shape.

12. The flexible display device of claim 1, further comprising a sawtooth member disposed to cover an outer surface of the roller and having a plurality of teeth on an outer surface thereof.

13. The flexible display device of claim 1, further comprising a support frame coupled to one side of a rear surface of the flexible display unit and configured to move along an outer surface of the roller in response to deformation of the flexible display unit.

14. The flexible display device of claim 13, wherein the support frame is provided with a plurality of support bars disposed side by side with being spaced apart from one another at regular intervals, and
- wherein each of the support bars moves with being in contact with the outer surface of the roller.

15. The flexible display device of claim 1, wherein the first body comprises sliding guides recessed into both inner surfaces, respectively, and
- wherein the second body comprises sliding members disposed to be relatively movable along the sliding guides.

16. The flexible display device of claim 1, further comprising a rear plate coupled to a rear surface of the flexible display unit to be deformed together with the flexible display unit.

* * * * *